(12) United States Patent
Noda

(10) Patent No.: US 7,268,628 B2
(45) Date of Patent: Sep. 11, 2007

(54) PREAMPLIFIER

(75) Inventor: Masaki Noda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 225 days.

(21) Appl. No.: 10/543,390

(22) PCT Filed: Mar. 25, 2004

(86) PCT No.: PCT/JP2004/004194

§ 371 (c)(1),
(2), (4) Date: Jul. 26, 2005

(87) PCT Pub. No.: WO2005/093946

PCT Pub. Date: Oct. 6, 2005

(65) Prior Publication Data
US 2006/0103471 A1    May 18, 2006

(51) Int. Cl.
H03F 3/08    (2006.01)
(52) U.S. Cl. .................................... 330/308; 330/86
(58) Field of Classification Search .......... 250/214 A, 250/214 AG; 330/86, 110, 308
See application file for complete search history.

(56) References Cited

U.S. PATENT DOCUMENTS 6,864,751 B1 * 3/2005 Schmidt et al. ............ 330/311

2005/0140454 A1 * 6/2005 Uesaka et al. ............ 330/308

FOREIGN PATENT DOCUMENTS

| EP | 0 568 880 A1 | 11/1993 |
| JP | 10-284955 A | 10/1998 |
| JP | 2001-144552 A | 5/2001 |
| JP | 2002-39827 A | 2/2002 |
| JP | 2003-163544 A | 6/2003 |
| JP | 2003-347861 A | 12/2003 |

OTHER PUBLICATIONS

H. Ikeda et al., IEEE Journal of Solid-State Circuits, vol. 36, No. 9, Sep. 2001 pp. 1303-1308.

* cited by examiner

Primary Examiner—Steven J. Mottola
(74) Attorney, Agent, or Firm—Birch, Stewart, Kolasch & Birch, LLP

(57) ABSTRACT

A preamplifier includes a negative-feedback amplifier circuit that converts a current signal from a photodetector into a voltage signal; and a conversion-gain control circuit that simultaneously controls a resistance value of a feedback resistor portion of the negative-feedback amplifier circuit and a resistance value of a load resistor portion of the negative-feedback amplifier circuit, based on the voltage signal from the negative-feedback amplifier circuit. Each of the feedback resistor portion and the load resistor portion includes a fixed resistor element, a MOSFET element, and a diode-connected transistor, connected in parallel.

5 Claims, 8 Drawing Sheets

PREAMPLIFIER

TECHNICAL FIELD

The present invention relates to a preamplifier used in an optical communication system and an optical receiver. More particularly, the present invention relates to a preamplifier with improved stability of operation and suppression of circuit saturation, or improved following characteristics of gain control.

BACKGROUND ART

A preamplifier is provided in a front-end of an optical receiver and has a function to convert a current signal to a voltage signal, the current signal being converted in a light receiving element that is a component of the optical receiver. The optical receiver is used in a system having various conditions such that the intensities of light received are different. Therefore, the preamplifier provided in the front end of the optical receiver requires wide dynamic range characteristics.

For this type of preamplifier, there has been an example of disclosure as a preamplifier having the wide dynamic range characteristics (see, for example, H. Ikeda, et al. "An Auto-Gain Control Transimpedance Amplifier with Low Noise and Wide Input Dynamic Range for 10-Gb/s Optical Communication Systems", IEEE J. Solid-State Circuits, vol. 36, pp. 1303-1308, 2001).

Disclosed in the above literature are a circuit configuration and various characteristics of the preamplifier having the wide dynamic range characteristics.

In the preamplifier disclosed in the above literature, a feedback resistor of a negative-feedback amplifier includes a parallel circuit having mainly a fixed resistor and a field effect transistor (FET). A gate terminal voltage of the FET is changed according to light receiving power to control a conversion gain, and a wide dynamic range is realized. If the light receiving power is low, the FET is completely OFF, and the preamplifier operates so that a resistance value of the feedback resistor becomes a resistance value of the fixed resistor. Then, if the FET becomes ON with an increase in the light receiving power, the preamplifier operates so that a combined resistance value of the fixed resistor and an ON resistor of the FET becomes a resistance value of the feedback resistor, i.e., a conversion gain of the preamplifier.

It is noted that the preamplifier has a capacitor for phase compensation provided in parallel with the feedback resistor, and by optimizing a capacity value of the capacitor, non-stability of the circuit due to an increase in the light receiving power is suppressed.

However, the preamplifier disclosed in the above literature can ensure phase allowance indicating a level of stability on frequency characteristics of an open loop by the phase compensation, but, a gain peak, in turn, occurs on frequency characteristics of a closed loop. This causes the conversion gain in a certain frequency band to increase and an output voltage waveform to be distorted, called "pattern effect".

In the preamplifier disclosed in the Non-patent literature 1, there is a time zone in which the conversion gain is large even though the light receiving power is high, during a transition state until the conversion gain becomes its stationary state. Therefore, an input terminal voltage of a load resistor becomes low in the negative-feedback amplifier in its transition state, and an excessive current flows into an input transistor and the load resistor, which may cause element destruction.

The present invention has been achieved to solve at least the conventional problems, and it is an object of the present invention to provide a preamplifier in which a waveform is less distorted and a control operation for a conversion gain is stable, without depending on whether the operation state is the transition state or the stationary state, and which has excellent wide dynamic range characteristics.

DISCLOSURE OF THE INVENTION

A preamplifier according to one aspect of the present invention includes a negative-feedback amplifier circuit that converts a current signal output from a light receiving element into a voltage signal; and a conversion-gain control circuit that simultaneously controls a resistance value of a feedback resistor portion of the negative-feedback amplifier circuit and a resistance value of a load resistor portion of the negative-feedback amplifier circuit, based on the voltage signal output from the negative-feedback amplifier circuit. Each of the feedback resistor portion and the load resistor portion includes a fixed resistor element, a metal-oxide-semiconductor field-effect-transistor (MOSFET) element, and a diode-connected transistor, connected in parallel.

According to the present invention, the negative-feedback amplifier circuit that includes an inverting amplifier circuit and an output buffer converts the output current signal output from the light receiving element to the voltage signal, and the conversion-gain control circuit concurrently controls the resistance value of the feedback resistor portion of the negative-feedback amplifier circuit and the resistance value of the load resistor portion thereof. Each of the feedback resistor portion and the load resistor portion includes the fixed resistor element, the MOSFET element, and the diode-connected transistor, which are connected in parallel with one another. Resistance values of the feedback resistor portion and the load resistor portion are varied by conduction control of the MOSFET element or the transistor.

BEST MODE FOR CARRYING OUT THE INVENTION

Exemplary embodiments of a preamplifier according to the present invention are explained in detail below with reference to the accompanying drawings. It is noted that the present invention is not limited by the embodiments.

Figure 1:
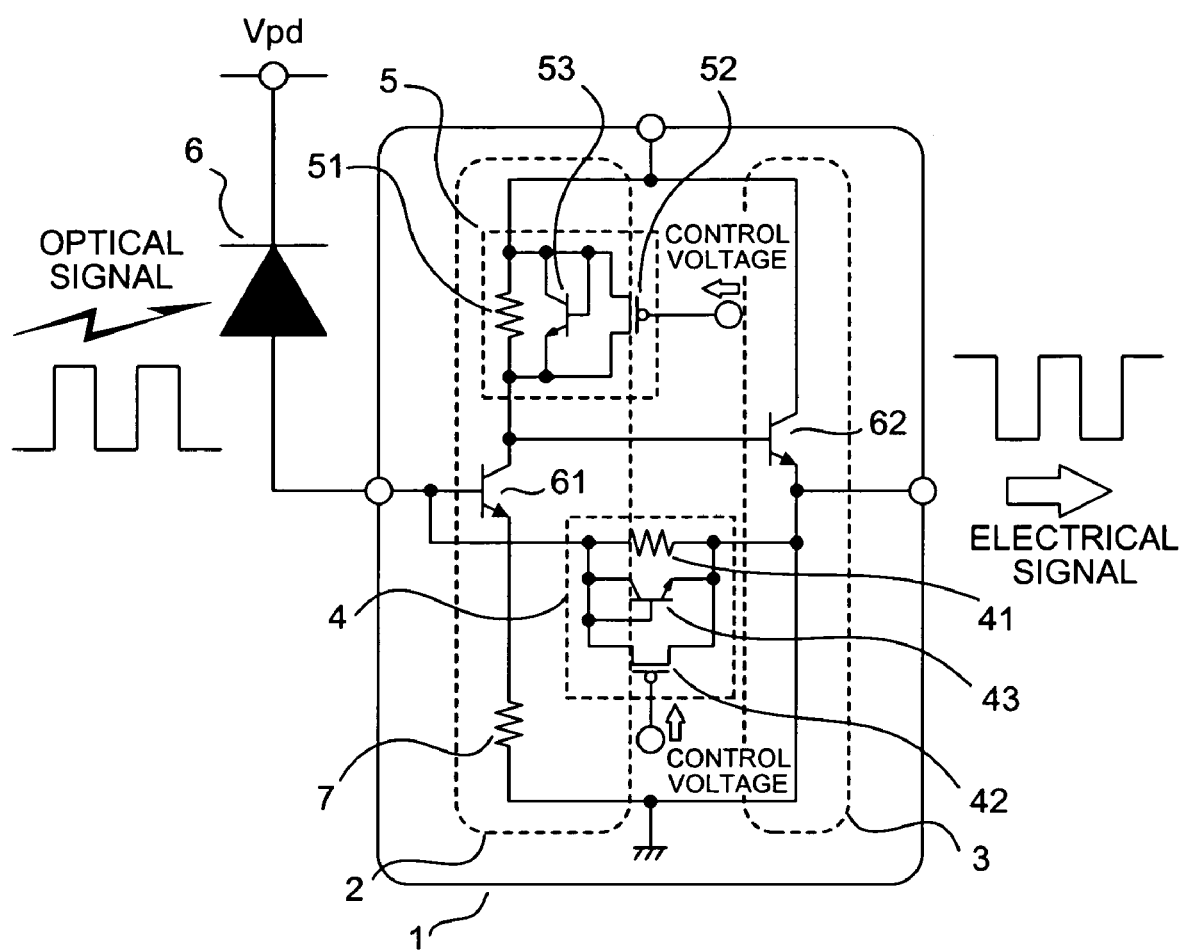
FIG. 1 is a diagram of a circuit configuration of a preamplifier according to a first embodiment of the present invention.

FIG. 1 is a diagram of a circuit configuration of a preamplifier according to a first embodiment of the present invention. A preamplifier 1 of this figure includes an inverting amplifier circuit 2, an output buffer circuit 3, a feedback resistor portion 4, and a load resistor portion 5. The feedback resistor portion 4 includes a fixed resistor element 41, a MOSFET 42, and a diode-connected transistor 43, which are connected in parallel to one another. Likewise, the load resistor portion 5 includes a fixed resistor element 51, a MOSFET 52, and a diode-connected transistor 53, which are connected in parallel to one another. Further, connections are provided in these circuits as follows. That is, a base terminal of a transistor 62 that is an input terminal of the output buffer circuit 3 is connected to a collector terminal of a transistor 61 that is an output terminal of the inverting amplifier circuit 2. An emitter terminal of the transistor 62 that is an output terminal of the output buffer circuit 3 is connected to a base terminal of the transistor 61 that is an input terminal of the inverting amplifier circuit 2. These two are connected to each other in the feedback resistor portion 4 to configure the negative-feedback amplifier circuit. Furthermore, a bias voltage Vpd is applied to a cathode terminal of a light receiving element 6, and an anode terminal thereof is connected to an input terminal of the preamplifier 1, i.e., the input terminal of the inverting amplifier circuit 2. A predetermined control voltage is supplied to gate terminals of the MOSFET 42 and the MOSFET 52. The control voltage is generated based on, for example, an output of the negative-feedback amplifier circuit.

Operation of the circuit of FIG. 1 is explained below. Details of operations of the MOSFET 42 and the diode-connected transistor 43 that form the feedback resistor portion 4 and details of operations of the MOSFET 52 and the diode-connected transistor 53 that form the load resistor portion 5 are explained later.

Referring to FIG. 1, an optical signal received in the optical receiver, which is not shown, is converted to a current signal in the light receiving element 6, and the current signal is converted to a voltage signal in the preamplifier 1 that includes the inverting amplifier circuit 2, the output buffer circuit 3, and the feedback resistor portion 4. In this type of preamplifier, transimpedance that is a ratio of an output voltage to an input current largely contributes to input-output characteristics of the circuit.

In the preamplifier 1 having the circuit configuration, the transimpedance is a resistance value of the feedback resistor portion 4, but the resistance value is controlled according to the light intensity of the optical signal received so that circuit saturation does not occur. More specifically, if the light intensity of the optical signal received is low, then the resistance value of the feedback resistor portion 4 is controlled so as to increase, and if the light intensity of the optical signal received is high, then the resistance value of the feedback resistor portion 4 is controlled so as to decrease.

In the preamplifier 1 according to the first embodiment, the resistance value of the load resistor portion 5 is also controlled concurrently with the feedback resistor portion 4. Note that the reason of controlling the resistance value of the load resistor portion 5 concurrently with the feedback resistor portion 4 is explained in detail below.

Figure 2:
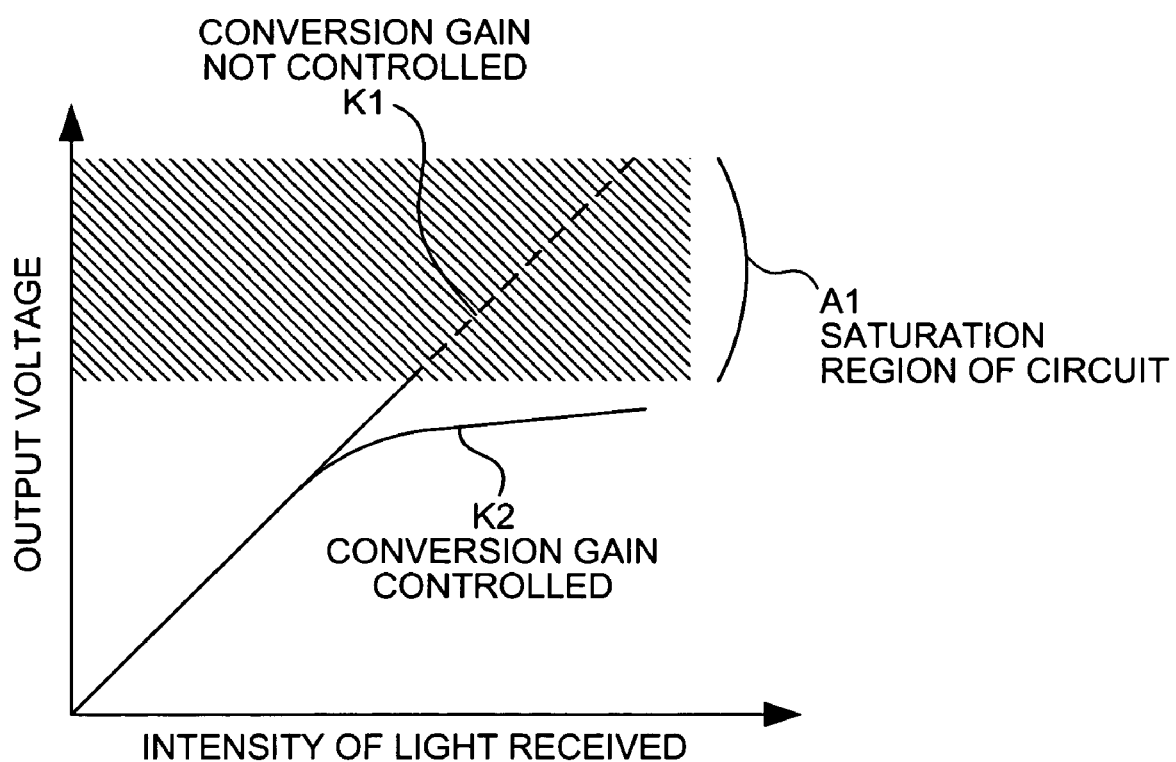
FIG. 2 is a diagram of input-output characteristics of the preamplifier.

The input-output characteristics of the preamplifier 1 according to the first embodiment are explained below. FIG. 2 is a diagram of the input-output characteristics of the preamplifier 1. More specifically, an output voltage of the preamplifier 1 with respect to the intensity of light received of the light receiving element 6 is plotted by curves such as a characteristic curve when the resistance value of the feedback resistor portion 4 is not controlled (K1: conversion gain not controlled) and another characteristic curve when the resistance value of the feedback resistor portion 4 is controlled (K2: conversion-gain controlled).

As shown in the characteristic curve K1 of FIG. 2, if the resistance value of the feedback resistor portion 4 is not controlled, that is, if the resistance value of the feedback resistor portion 4 is a fixed value and if the intensity of the light received is low, the output voltage is linearly amplified. However, if the intensity of the light received increases, the output voltage enters a saturation region of the circuit as indicated by region A1, which causes waveform distortion to occur. Therefore, if the resistance value of the feedback resistor portion 4 is not controlled, a sufficient dynamic range cannot be ensured.

On the other hand, in the preamplifier according to the first embodiment, the resistance value of the feedback resistor portion 4 is controlled based on the intensity of the light received. Therefore, as shown in the characteristic curve K2 of FIG. 2, when the intensity of the light received is high, the conversion gain decreases, and the output voltage becomes low to be prevented from its entering the saturation region of the circuit. Therefore, according to the first embodiment configured to control the resistance value of the feedback resistor portion 4, it is possible to ensure a sufficient dynamic range without waveform distortion.

Figure 3:
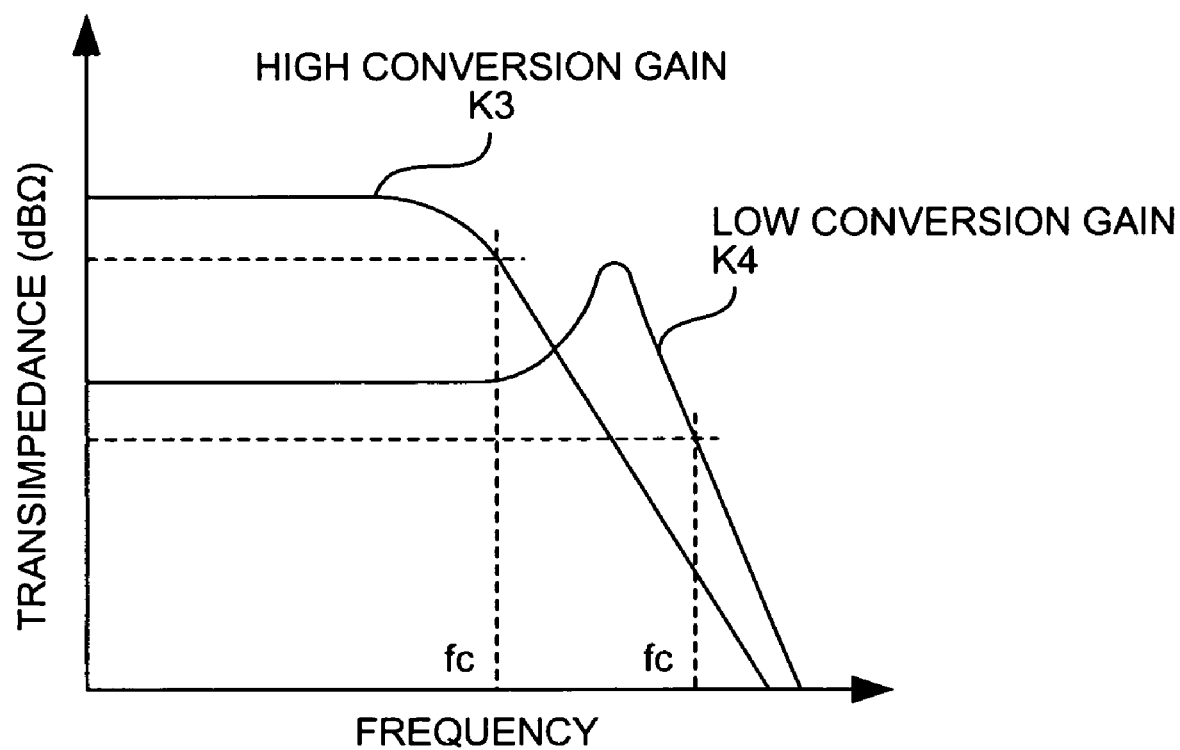
FIG. 3 is a diagram of change characteristics of transimpedance with respect to frequencies upon control over a feedback resistor.

FIG. 3 is a diagram of change characteristics of transimpedance with respect to frequencies upon control over the feedback resistor portion 4. In this figure, a transimpedance value is represented by a decibel value. As shown by a characteristic curve K3 and a characteristic curve K4 of FIG. 3, if the resistance value of the feedback resistor portion 4 decreases (high conversion gain (low conversion gain), a cutoff frequency fc of the preamplifier 1 increases, and a peak of gain occurs on the frequency characteristics of a closed loop. As a result, there occurs a phenomenon such that the conversion gain in a frequency band lower than the cutoff frequency increases which causes the output voltage waveform to be distorted. The distortion of the output voltage waveform is well known as the pattern effect.

Figure 4:
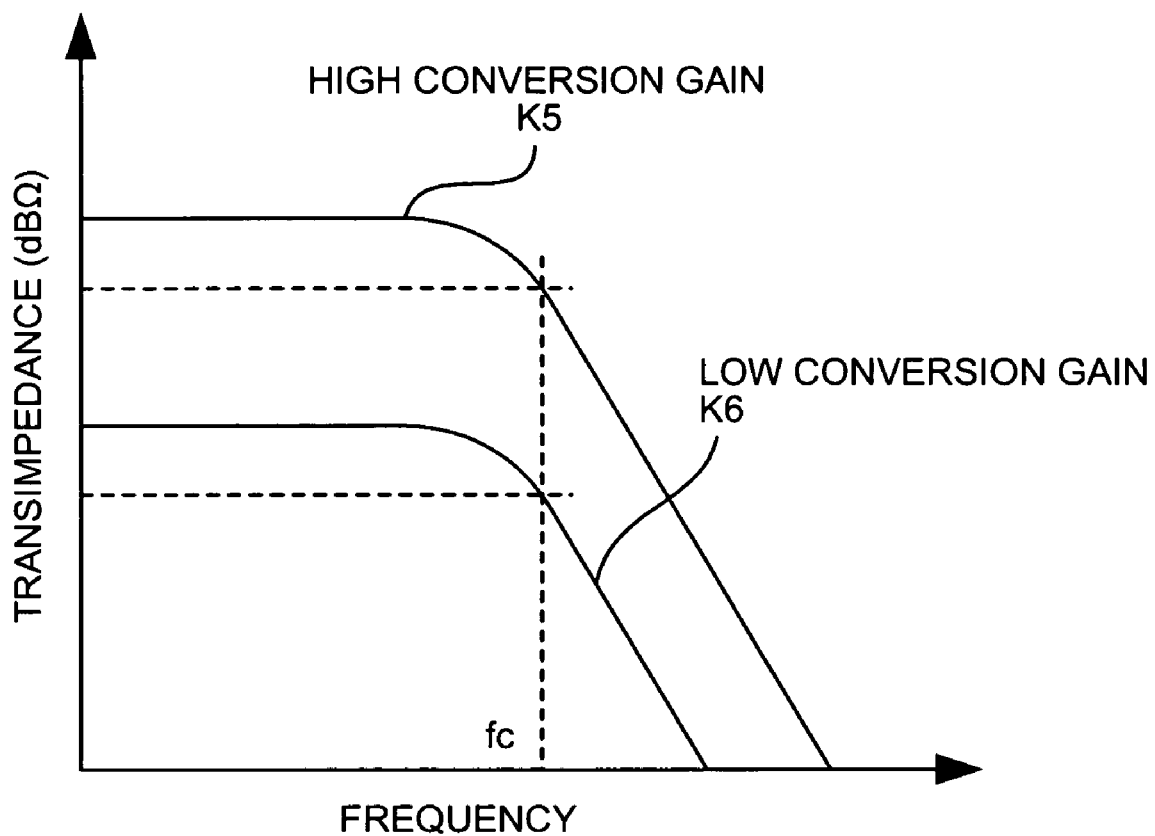
FIG. 4 is a diagram of change characteristics of transimpedance with respect to frequencies upon concurrent control for the feedback resistor and a load resistor.

In the preamplifier 1 according to the first embodiment, the resistance value of the load resistor portion 5 is controlled concurrently with the resistance value of the feedback resistor portion 4 so that the cutoff frequency $f_c$ becomes a fixed value. The characteristics at this time are shown in FIG. 4. That is, FIG. 4 is a diagram of change characteristics of transimpedance with respect to frequencies upon concurrent control over the feedback resistor portion 4 and the load resistor portion 5. As shown by a characteristic curve K5 and a characteristic curve K6 of FIG. 4, even if the resistance value of the feedback resistor portion 4 changes, by controlling the load resistor portion 5, the cutoff frequency of the preamplifier 1 can be controlled to an almost fixed value. Therefore, it is possible to ensure phase allowance and hold stability of the circuit upon conversion-gain control without causing a gain peak to occur on the frequency characteristics of the closed loop. In other words, it is possible to obtain the preamplifier excellent in the wide dynamic range characteristics without causing waveform distortion to occur.

The contents above are explained below using equations. At first, a cutoff frequency $f_c$ of the preamplifier as a negative feedback amplification type can be expressed by the following equation, where $R_f$ is a resistance value of the feedback resistor portion 4 between an input and an output of the inverting amplifier circuit, $C_i$ is an input capacity of the preamplifier, and G is an open-loop gain (gain without negative feedback) of the preamplifier 1.

$$f_c = \frac{G}{2\pi \cdot R_f \cdot C_i} \quad (1)$$

As indicated in the above equation, in order to obtain a high conversion gain when the intensity of the light received is low, the resistance value $R_f$ of the feedback resistor portion 4 is controlled to increase. Conversely, in order to obtain a low conversion gain when the intensity of the light received is high, the resistance value $R_f$ thereof is controlled to decrease. Therefore, as is apparent from the equation (1), the cutoff frequency $f_c$ increases upon the low conversion gain as compared with that upon the high conversion gain.

The open-loop gain G of the preamplifier 1 is a voltage gain of an emitter grounded amplifier that forms the inverting amplifier circuit 2, and is expressed by the following equation, where $R_e$ is a resistance value of an emitter resistor 7 of the emitter grounded amplifier, and $R_c$ is a resistance value of the load resistor portion 5.

$$G = \frac{R_C}{R_e} \quad (2)$$

In the equation (1), the only thing not to change the cutoff frequency $f_c$ is to also concurrently change the open-loop gain G of the preamplifier 1 as expressed in the equation (2), according to a change in the resistance value $R_f$ of the feedback resistor portion 4. In other words, by controlling the resistance value $R_c$ of the load resistor portion 5 according to the change in the resistance value $R_f$ of the feedback resistor portion 4, the cutoff frequency $f_c$ can be caused to remain within a predetermined range.

Referring back to FIG. 1, operations of the feedback resistor portion 4 and the load resistor portion 5 are explained in detail below.

At first, it is considered the case where each of the feedback resistor portion 4 and the load resistor portion 5 includes only a MOSFET and therefore no diode-connected transistor is provided in FIG. 1.

It is generally known that an equivalent resistance between the drain and source terminals of the MOSFET changes according to potential (potential at a gate terminal) applied to its gate terminal. Therefore, a resistance combined with the fixed resistor element 41 is made to change by a control voltage that is applied to the gate terminal of the MOSFET 42 and is determined based on an output voltage changing according to the light intensity of the optical signal received, and a conversion gain is controlled thereby. Likewise, a resistance combined with the fixed resistor element 51 is made to change by a control voltage applied to the gate terminal of the MOSFET 52, and an open-loop gain is also controlled thereby. Therefore, the conversion-gain control according to the intensity of the light received and stabilization control of the cutoff frequency can be concurrently performed.

However, a predetermined time is required until the control is settled only when the conversion gain is controlled based on the control of a gate terminal voltage of the MOSFET. And a state where the conversion gain is large is maintained during a transition state up to the stationary state. As a result, if the state is in the transition state and the intensity of light received is high, circuit saturation may occur in the preamplifier 1. Furthermore, in some cases, the components forming the preamplifier 1 may be destroyed caused by overcurrent.

In addition to the MOSFET, a diode-connected transistor is therefore added to each of the feedback resistor portion 4 and the load resistor portion 5.

It is generally known that the diode-connected transistor enters a conducting state when a potential difference between the base terminal and the emitter terminal becomes about 0.8 volt or more, and that the equivalent resistance between the collector terminal and the emitter terminal decreases. Therefore, the diode-connected transistor functions so that if the voltage across terminals applied to both ends of the feedback resistor portion 4 becomes about 0.8 volt or more depending on the light intensity of the optical signal received, the combined resistance value of the feedback resistor portion 4 decreases and the conversion gain decreases. Likewise, it functions so that if the voltage across terminals applied to both ends of the load resistor portion 5 becomes about 0.8 volt or more, the combined resistance value of the load resistor portion 5 decreases and the open-loop gain decreases.

Therefore, for the conversion-gain control using the diode-connected transistors 43 and 53 as are the configurations of the feedback resistor portion 4 and the load resistor portion 5 of the first embodiment, if a voltage between the base terminal and the emitter terminal of each of the diode-connected transistors 43 and 53 becomes about 0.8 volt or more, the diode-connected transistors 43 and 53 instantaneously operate bit by bit. This makes it possible to prevent circuit saturation and destruction of the components of the preamplifier 1 even if the state is in the transition state as above and the intensity of the light received is high.

In the conversion-gain control only by the diode-connected transistor, the conversion gain decreases only when the intensity of the light received is in a high level, and the conversion gain is maintained high when the intensity thereof is in a low level. As a result, an S/N ratio (signal-to-noise ratio) of the output voltage of the preamplifier 1 is degraded, and there is concern that reception sensitivity may be deteriorated.

In such a case as explained above, when the state of the conversion-gain control is the stationary state, by controlling the gate terminal voltage of the MOSFET so that a voltage across the terminals of the feedback resistor portion 4 becomes about 0.8 or less, the diode-connected transistor is turned ON only when the state of the conversion-gain control is the transition state. Conversely, the diode-connected transistor is turned OFF in the stationary state, and therefore, there is no concern that the reception sensitivity is deteriorated.

As explained above, according to the preamplifier of the first embodiment, it is configured to concurrently control the MOSFETs 42 and 52 and the diode-connected transistors, based on the light intensity of the optical signal received, so that they are brought into conduction. Therefore, it is possible to obtain the preamplifier excellent in the wide dynamic range characteristics without occurrence of waveform distortion while the circuit saturation and the destruction of the components in the transition state are suppressed and the stability of the circuit upon conversion-gain control is maintained.

Figure 5:
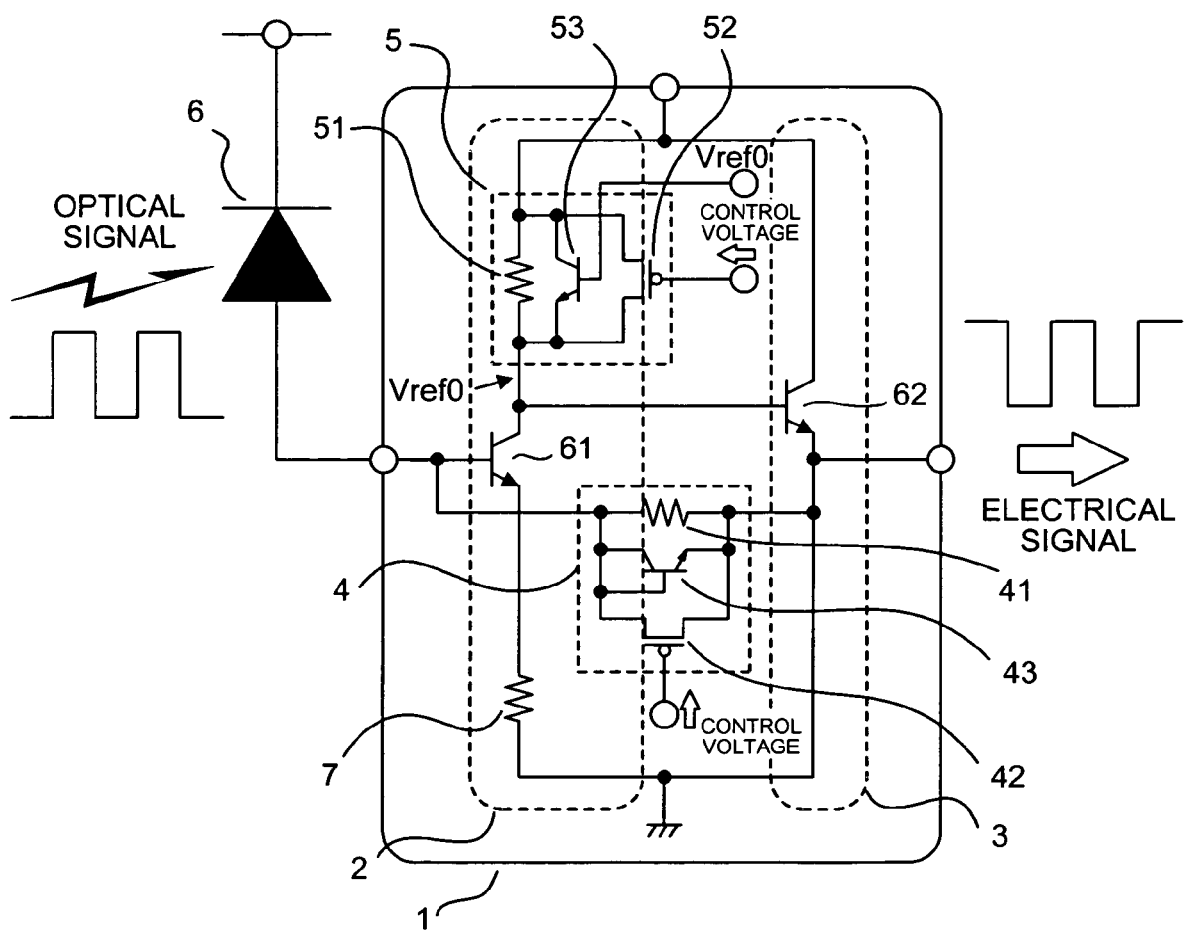
FIG. 5 is a diagram of a circuit configuration of a preamplifier according to a second embodiment of the present invention.

FIG. 5 is a diagram of a circuit configuration of a preamplifier according to a second embodiment of the present invention. In this figure, portions the same as or equivalent to these in FIG. 1 are represented by the same signs. As shown in FIG. 5, a reference voltage $V_{ref0}$ is supplied to the base terminal of the diode-connected transistor 53 that forms the load resistor portion 5. It is assumed that a collector terminal voltage of the transistor 61 provided in the inverting amplifier circuit 2 is defined as an input terminal voltage $V_{ref1}$. Based on this, the reference voltage $V_{ref0}$ becomes equivalent to the collector terminal voltage upon no signal input, that is, when the signal is not input to the inverting amplifier circuit 2.

Operation of the circuit as shown in FIG. 5 is explained below. If a current $I_1$ flows into the feedback resistor portion 4 when an optical signal with a predetermined light intensity is received, the input terminal voltage $V_{ref1}$ that is the collector terminal voltage of the transistor 61 can be expressed by the following equation.

$$V_{ref1} = V_{ref0} - R_f \times I_1 \quad (3)$$

A relation expressed in equation (3) can be considered as follows. More specifically, when the current $I_1$ flowing upon reception of the optical signal with the predetermined light intensity flows through the feedback resistor portion 4, a potential at an emitter terminal of the transistor 62 provided in the output buffer circuit 3 drops by $R_f \times I_1$ from the potential at the emitter terminal when no optical signal is input. On the other hand, the transistor 62 operates so that a predetermined voltage drop (about 0.8 volt) between the base terminal and the emitter terminal is maintained. Therefore, the collector terminal voltage of the transistor 62 also drops by $R_f \times I_1$. Since the voltage drop is caused by a change in the current flowing through the load resistor portion 5, a difference between the input terminal voltage Vref0 upon no signal input and the input terminal voltage Vref1 when the current I1 flows through the feedback resistor portion 4 becomes almost equal to $R_f \times I_1$.

As shown in FIG. 5, therefore, the voltage between the base terminal and the emitter terminal of the diode-connected transistor 43 that forms the feedback resistor portion 4 is almost equal to the voltage between the base terminal and the emitter terminal of the diode-connected transistor 53 that forms the load resistor portion 5. In other words, when the optical signal with the predetermined light intensity or higher is received, the circuit operates so that the diode-connected transistor 43 that forms the feedback resistor portion 4 and the diode-connected transistor 53 that forms the load resistor portion 5 are made to concurrently turn ON.

If the diode-connected transistor 43 that forms the feedback resistor portion 4 is in the ON state and the diode-connected transistor 53 that forms the load resistor portion 5 is in the OFF state, the circuit operates in a state where the open-loop gain is high, although the conversion gain is low. This causes the phase allowance not to be ensured and the circuit to oscillate, that is, the operation of the circuit may become unstable.

Conversely, if the diode-connected transistor 43 that forms the feedback resistor portion 4 is in the OFF state and the diode-connected transistor 53 that forms the load resistor portion 5 is in the ON state, the open-loop gain is low although the conversion gain is high. Therefore, a cutoff frequency becomes low, which may cause an adequate output voltage waveform not to be obtained.

According to the second embodiment, however, if the light intensity of the optical signal received is high, the circuit operates so that the diode-connected transistor 43 that forms the feedback resistor portion 4 and the diode-connected transistor 53 that forms the load resistor portion 5 are made to almost concurrently turn ON. Thus, it is possible to obtain the preamplifier excellent in the wide dynamic range characteristics by suppressing waveform distortion without loss of the stability of the circuit.

Figure 6:
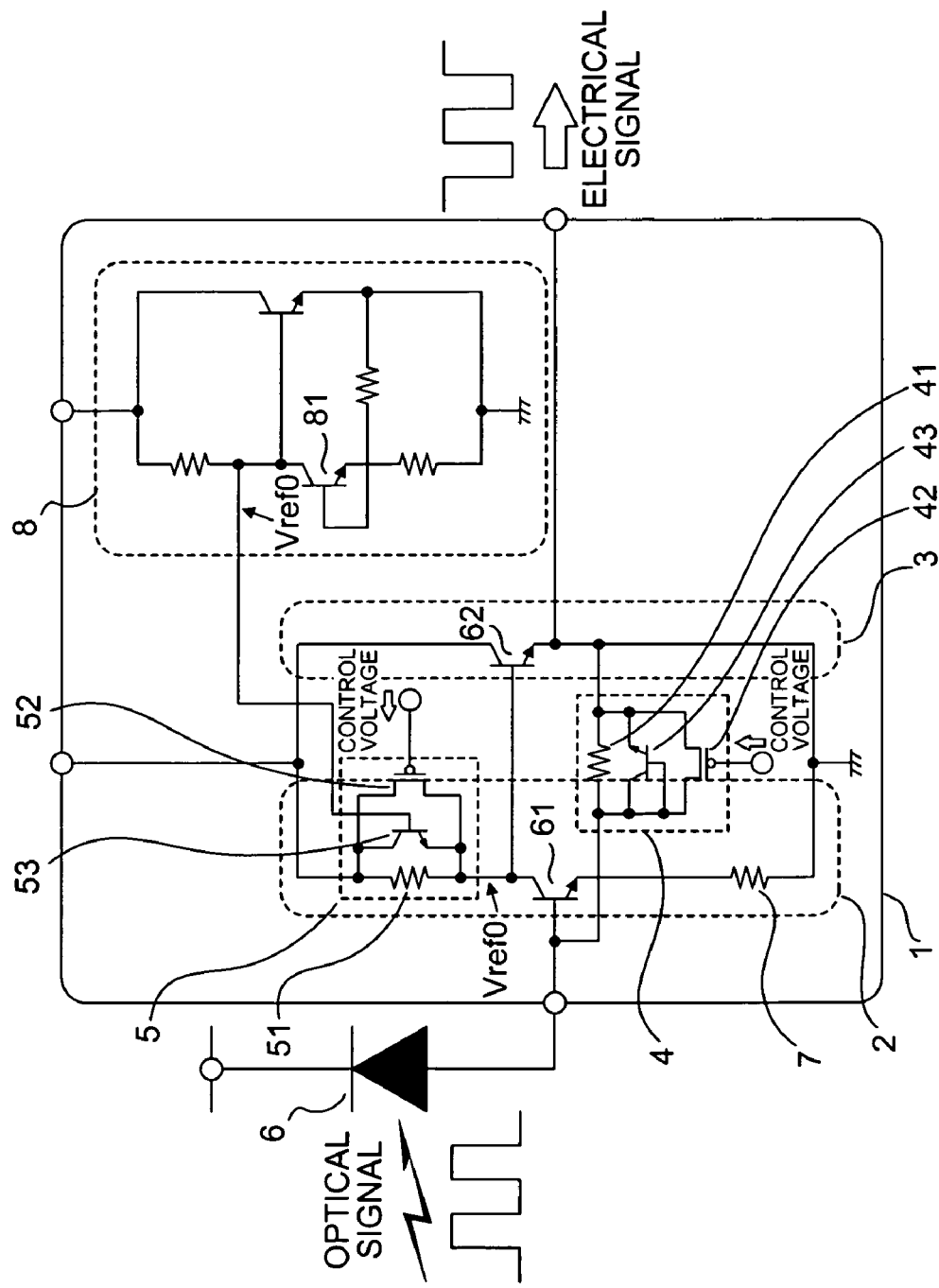
FIG. 6 is a diagram of a circuit configuration of a preamplifier according to a third embodiment of the present invention.

FIG. 6 is a diagram of a circuit configuration of a preamplifier according to a third embodiment of the present invention. In this figure, portions the same as or equivalent to these in FIG. 1 are represented by the same signs. As shown in FIG. 6, a reference-bias-voltage generating circuit 8 includes a circuit equivalent to the preamplifier 1 of FIG. 1, i.e., the negative-feedback amplifier circuit. Further, a collector terminal of a transistor 81 that is an output terminal of the inverting amplifier circuit that forms the reference-bias-voltage generating circuit 8 is connected to the base terminal of the diode-connected transistor 53.

Operation of the circuit as shown in FIG. 6 is explained below. The reference-bias-voltage generating circuit 8 includes circuits equivalent to the basic components of the preamplifier 1 excluding the reference-bias-voltage generating circuit 8. Therefore, a voltage at the collector terminal of the transistor 81 that is an output terminal of the reference-bias-voltage generating circuit 8 becomes almost equivalent to the input terminal voltage (the voltage at the collector terminal of the transistor 61 that is the output terminal of the inverting amplifier circuit 2) $V_{ref0}$ upon no signal input.

It is noted that values of $V_{ref0}$ fluctuate depending on fluctuations in a supply voltage and fluctuations in ambient temperature. However, the reference-bias-voltage generating circuit 8 includes the circuits equivalent to the basic components of the preamplifier 1 excluding the reference-bias-voltage generating circuit 8. Therefore, it is controlled so that the change in $V_{ref0}$ due to the fluctuation in the supply voltage and the fluctuation in the ambient temperature is cancelled and the voltage between the base terminal and the emitter terminal of the transistor 53 is made to be a fixed value.

As explained above, according to the third embodiment, if the light intensity of the optical signal received is high, regardless of fluctuations in the supply voltage and fluctuations in the ambient temperature, the circuit operates so that the diode-connected transistor 43 that forms the feedback resistor portion 4 and the diode-connected transistor 53 that forms the load resistor portion 5 are made to concurrently turn ON. Thus, it is possible to obtain the preamplifier excellent in the wide dynamic range characteristics by suppressing waveform distortion without loss of the stability of the circuit.

Figure 7:
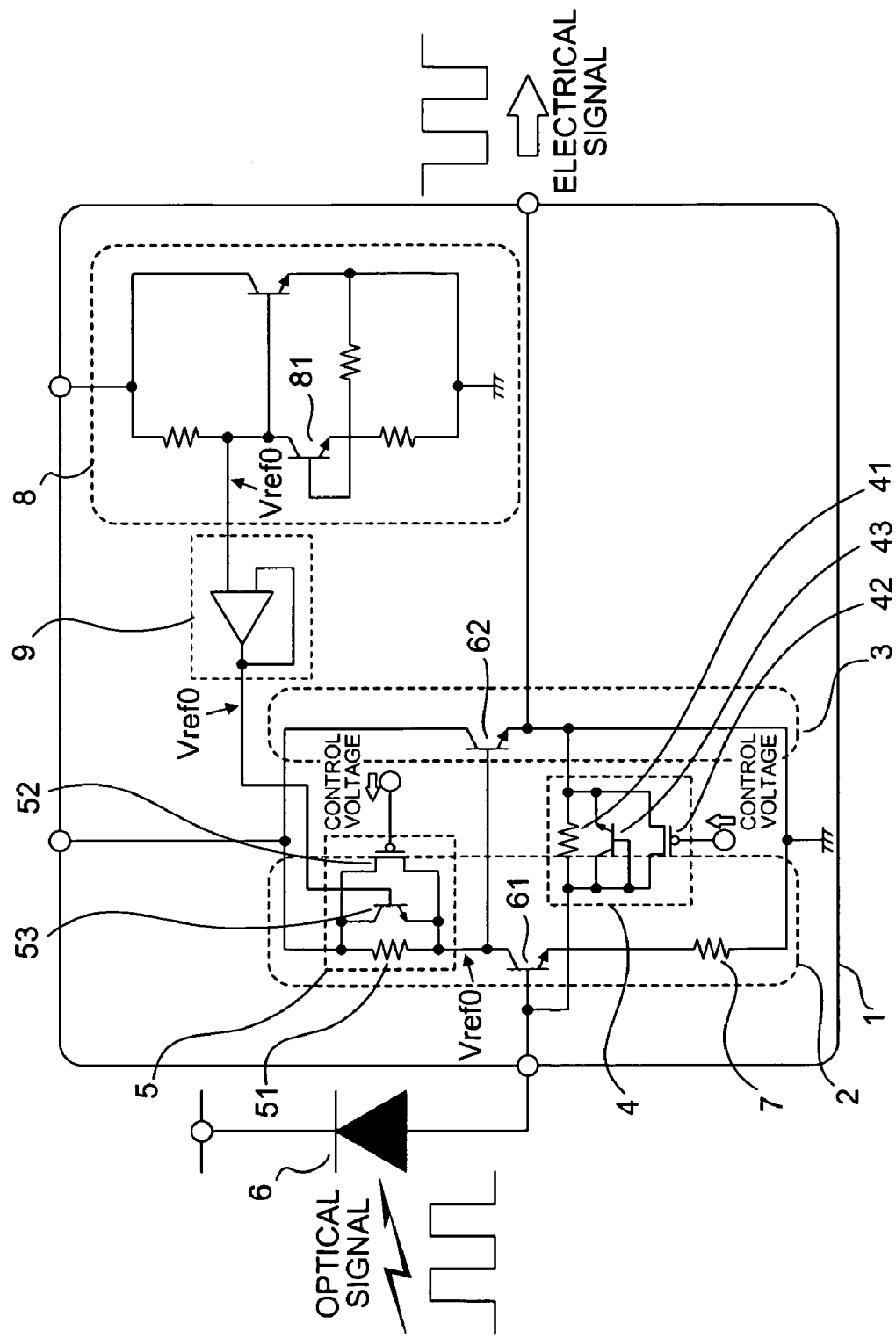
FIG. 7 is a diagram of a circuit configuration of a preamplifier according to a fourth embodiment of the present invention.

FIG. 7 is a diagram of a circuit configuration of a preamplifier according to a fourth embodiment of the present invention. In this figure, portions the same as or equivalent to these in FIG. 6 are represented by the same signs. As shown in FIG. 7, the output terminal of the reference-bias-voltage generating circuit 8 and the base terminal of the diode-connected transistor 53 are connected to each other through a voltage follower circuit 9.

Operation of the circuit as shown in FIG. 7 is explained below. An ideal input impedance of the voltage follower circuit 9 including an operational amplifier is infinitely large, and an ideal output impedance thereof is infinitely small.

More specifically, by connecting the reference-bias-voltage generating circuit 8 to the base terminal of the diode-connected transistor 53 through the voltage follower circuit 9, the circuit can be made to operate in an ideal manner without change in operation conditions of the reference-bias-voltage generating circuit 8 and the negative-feedback amplifier circuit.

As explained above, according to the fourth embodiment, if the light intensity of the optical signal received is high, regardless of fluctuations in the supply voltage and fluctuations in the ambient temperature, the circuit operates so that the diode-connected transistor 43 that forms the feedback resistor portion 4 and the diode-connected transistor 53 that forms the load resistor portion 5 are made to concurrently turn ON under the ideal conditions. Thus, it is possible to obtain the preamplifier excellent in the wide dynamic range characteristics by suppressing waveform distortion without loss of the stability of the circuit.

Figure 8:
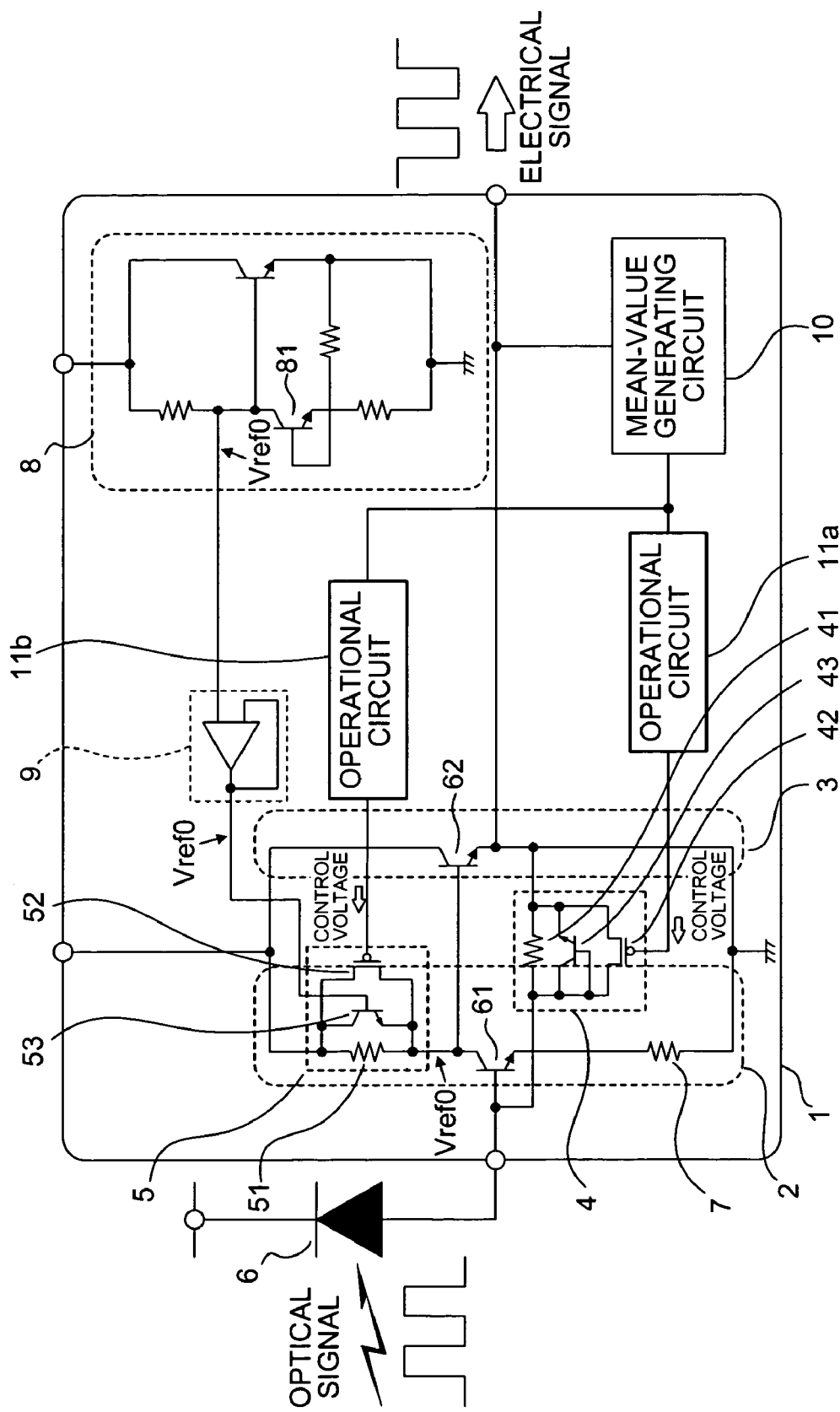
FIG. 8 is a diagram of a circuit configuration of a preamplifier according to a fifth embodiment of the present invention.

FIG. 8 is a diagram of a circuit configuration of a preamplifier according to a fifth embodiment of the present invention. In this figure, portions the same as or equivalent to these in FIG. 7 are represented by the same signs. The preamplifier 1 of FIG. 8 includes a mean-value detecting circuit 10 that generates a mean value of output voltage signals of the output buffer circuit 3, an operational circuit 11a that generates a gate terminal voltage for controlling a resistance value of the MOSFET 42 that forms the feedback resistor portion 4 based on the output of the mean-value detecting circuit 10, and an operational circuit 11b that generates a gate terminal voltage for controlling a resistance value of the MOSFET 52 that forms the load resistor portion 5 based on the output thereof, and these operational circuits 11a and 11b output the respective gate terminal voltages.

Operation of the circuit as shown in FIG. 8 is explained below. The mean-value detecting circuit 10 detects and outputs a mean value of output voltage signals of the output buffer circuit 3 that change according to the intensity of light received. The operational circuit 11a generates and outputs the gate terminal voltage to be applied to the MOSFET 42 in order to decide a combined resistance value of the feedback resistor portion 4 based on the output of the mean-value detecting circuit 10. Likewise, the operational circuit 11b generates and outputs the gate terminal voltage to be applied to the MOSFET 52 in order to decide a combined resistance value of the load resistor portion 5 based on the output of the mean-value detecting circuit 10.

As shown in FIG. 8, a feedback loop is formed with the negative-feedback amplifier circuit including the inverting amplifier circuit 2 and the output buffer circuit 3, the mean-value detecting circuit 10, and the operational circuits 11a and 11b. This formation causes the output to flexibly follow the changes in the intensity of the light received.

As a circuit (sensor) that detects an output of the output buffer circuit 3, for example, a case as follows is studied. The case is such that a feedback loop is formed with a low-peak detecting circuit but not with the mean-value detecting circuit as shown in FIG. 8. An ordinary low-peak detecting circuit has a characteristic such that it holds a low peak value when the intensity of the light received changes in a direction in which the intensity becomes lower, although it has an excellent following capability. Therefore, the low-peak detecting circuit has a defect such that the following capability is deteriorated when the intensity of the light received is low. Furthermore, the low-peak detecting circuit has also a defect such that a mean value deviates from an actual mean value if an extinction ratio is low when the mean value is to be detected from medium values in an OFF level of the optical output, although no problem occurs if the extinction ratio of the optical signal is infinite.

However, as shown in the fifth embodiment, if the mean-value detecting circuit is used as the circuit (sensor) that detects an output of the output buffer circuit 3, the output can be made to flexibly follow changes in light intensity of the optical signal received, and an accurate mean value can be always output, which makes it possible to resolve the defects.

As explained above, according to the fifth embodiment, the output is allowed to accurately and flexibly follow the changes in the light intensity of the optical signal received. Thus, it is possible to obtain the preamplifier excellent in the wide dynamic range characteristics by suppressing waveform distortion without loss of the stability of the circuit.

INDUSTRIAL APPLICABILITY

The preamplifier according to the present invention is useful as a preamplifier for the optical communication systems and optical receivers, and particularly, the preamplifier is suitable for the case where the wide dynamic range characteristics are desired to be ensured in the optical communication systems and the optical receivers.

The invention claimed is:

1. A preamplifier comprising:
a negative-feedback amplifier circuit that converts a current signal output from a light receiving element into a voltage signal; and
a conversion-gain control circuit that simultaneously controls a first resistance value of a feedback resistor portion of the negative-feedback amplifier circuit and a second resistance value of a load resistor portion of the negative-feedback amplifier circuit, based on the voltage signal output from the negative-feedback amplifier circuit, wherein
each of the feedback resistor portion and the load resistor portion includes a fixed resistor element, a metal-oxide-semiconductor field-effect-transistor element, and a diode-connected transistor, connected in parallel.

2. The preamplifier according to claim 1, wherein a base terminal voltage of a transistor that forms the load resistor portion is substantially same voltage as an output voltage of an inverting amplifier circuit that forms the negative-feedback amplifier circuit when the current signal is not output.

3. The preamplifier according to claim 2, further comprising a reference-bias-voltage generating circuit that is formed with a circuit equivalent to the negative-feedback amplifier circuit, wherein
an output terminal of the reference-bias-voltage generating circuit is connected to a base terminal of the transistor that forms the load resistor portion.

4. The preamplifier according to claim 3, wherein a voltage follower circuit is connected between the output terminal of the reference-bias-voltage generating circuit and the base terminal of the transistor that forms the load resistor portion.

5. The preamplifier according to claim 1, wherein the conversion-gain control circuit includes
a mean-value generating circuit that generates a mean value of the voltage signal output from the negative-feedback amplifier circuit; and
an operational circuit that converts an output voltage of the mean-value generating circuit into a control voltage for controlling each of the first resistance value and the second resistance value.

* * * * *